United States Patent [19]

Ikeuchi et al.

[11] Patent Number: 5,214,375

[45] Date of Patent: May 25, 1993

[54] MULTI-POINT PROBE ASSEMBLY FOR TESTING ELECTRONIC DEVICE

[75] Inventors: Harunobu Ikeuchi, Tokyo; Miyoshi Okumura, Kanagawa; Kaoru Sato, Tokyo; Yutaka Okumura, Kanagawa, all of Japan

[73] Assignee: Giga Probe, Inc., Kanagawa, Japan

[21] Appl. No.: 859,245

[22] Filed: Mar. 26, 1992

Related U.S. Application Data

[63] Continuation of Ser. No. 474,924, Feb. 6, 1990, abandoned.

[30] Foreign Application Priority Data

Feb. 6, 1989 [JP] Japan .................. 1-26948
Jul. 19, 1989 [JP] Japan .................. 1-187033
Aug. 7, 1989 [JP] Japan .................. 1-204121

[51] Int. Cl.$^5$ .................. G01R 1/06; G01R 31/02
[52] U.S. Cl. .................. 324/158 P; 324/158 F; 439/482
[58] Field of Search .................. 324/158 F, 158 P, 725; 439/482, 824

[56] References Cited

U.S. PATENT DOCUMENTS

| | | | |
|---|---|---|---|
| 4,035,722 | 7/1977 | Ryabov et al. | 324/158 P |
| 4,045,737 | 8/1977 | Coberly | 324/158 F |
| 4,965,865 | 10/1990 | Trenary | 324/158 P |
| 5,049,813 | 9/1991 | Van Loan et al. | 324/158 R |

FOREIGN PATENT DOCUMENTS

| | | |
|---|---|---|
| 0157835 | 12/1982 | Fed. Rep. of Germany ... 324/158 P |
| 54-43354 | 12/1979 | Japan . |
| 0013742 | 2/1981 | Japan .................. 324/158 P |

OTHER PUBLICATIONS

Virginia Panel Corporation (VAC); "Replaceable spring contacts for positive electrical contact"; Cat. No. 104 (May 20, 1983).

Primary Examiner—Vinh Nguyen
Attorney, Agent, or Firm—Lowe, Price, LeBlanc & Becker

[57] ABSTRACT

A test probe assembly including a plurality of electrically conductive probe arms each of which is secured to a substrate and electrically coupled to one of electrically conductive lines provided on the substrate. An intermediate portion of the arm is arranged to be resiliently deformable when a probe point which extends therefrom comes into contact with a terminal of the electronic device under test. A guide is provided on the structure on which the arms are mounted, for guiding the probe point so that movement other than reciprocation is either prevented or arrested. The resilient portion is arranged with respect to the probe point so that generation of motion other than reciprocation of the probe point is attenuated.

4 Claims, 7 Drawing Sheets

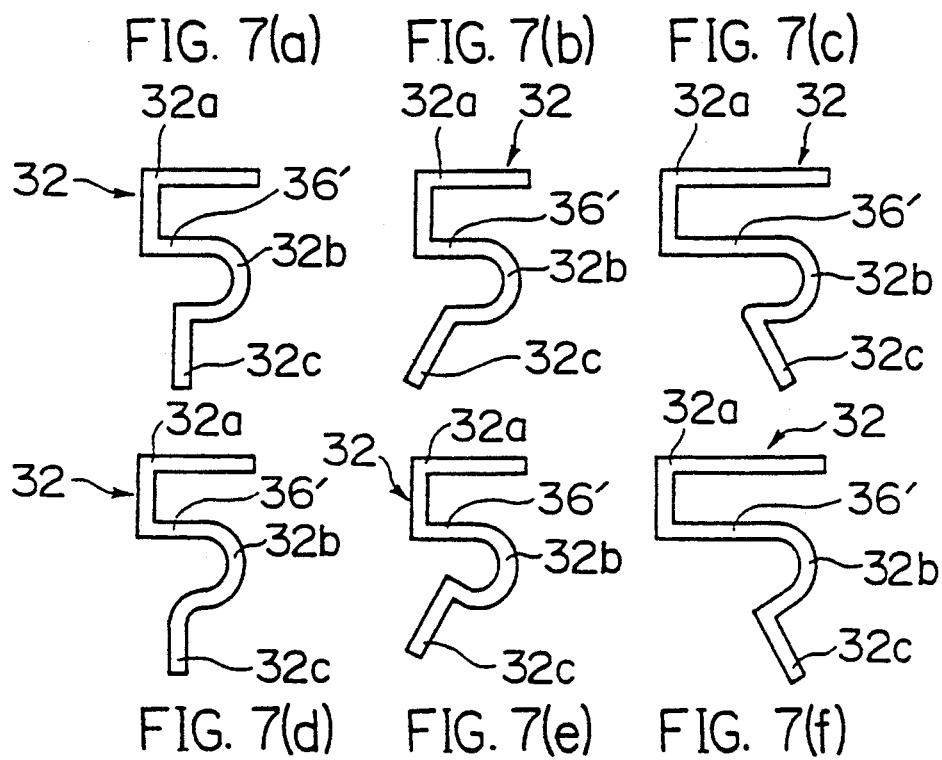
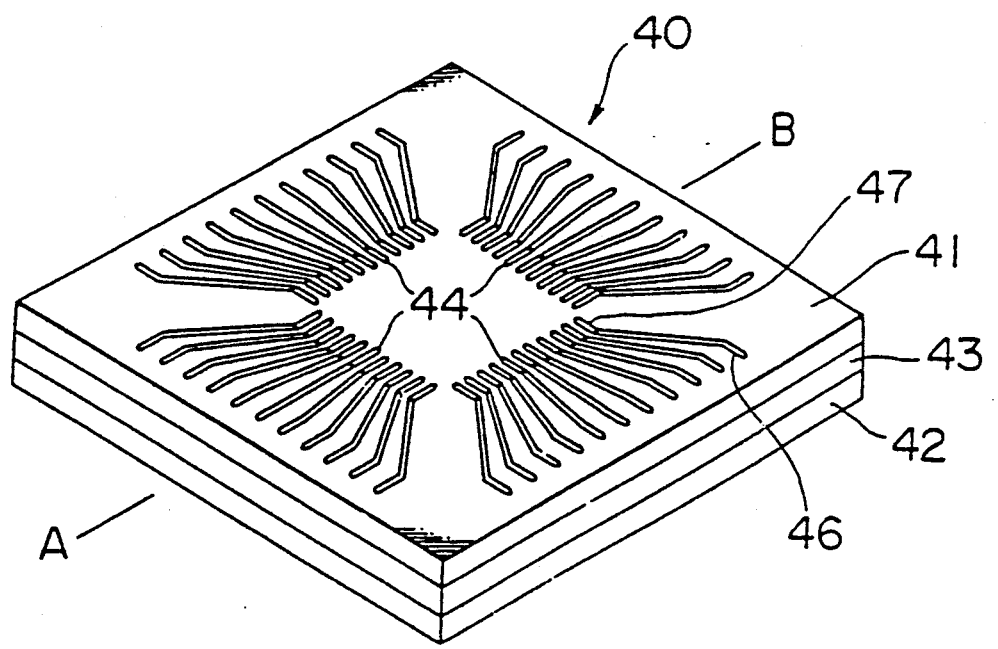

MULTI-POINT PROBE ASSEMBLY FOR TESTING ELECTRONIC DEVICE

This application is a continuation of application Ser. No. 07/474,924, filed Feb. 6, 1990, now abandoned.

BACKGROUND OF THE INVENTION

The present invention relates generally to multi-point probe assemblies for testing electronic devices, and more particularly to such a probe assembly having a plurality of probe arms which are brought into electrical contact with signal-receiving and feeding terminals of a small-sized electronic device (wafer) such as an integrated circuit for a flat panel display or the like.

Various types of multi-point test probe assemblies have been developed hitherto for testing electronic devices of the above mentioned type. One example of such a device is disclosed in Japanese Patent Publication No. 54-43354 (corresponding to U.S. application Ser. No. 799,472 filed Feb. 14, 1969).

This prior art test probe assembly, illustrated in FIGS. 1 and 2, is equipped with a plurality of needle-like probe arms 2. Each of these arms have a radially outboard end secured fixedly to a printed board 1, and an intermediate portion which is supported by a combination of a circularly shaped supporting member 4 and a circularly shaped holding member 5 positioned on one of two main surfaces of the printed board 1. As shown in FIG. 1, the probe arms 2 are arranged in an essentially conical formation and at predetermined angular intervals with respect to the center of the printed board 1.

The radially outer end portions of the probe arms are connected to printed lines 6 formed on one surface of the printed board 1 by means of soldering (7). These printed lines 6 extend into through-holes 8 and are connected with pins (terminals) (not shown) of an external electronic-device test system, which are received therein.

The inboard end portions of the probe arms 2 protrude into the space formed inside the holding member 5 in a manner such that probe-points 3 formed at the inboard ends of the probe arms are accurately positioned on a given plane below the lower surface of the holding member 5.

During testing of an electronic device (not shown), the probe points 3 are respectively brought into contact with terminals of the electronic device with a predetermined force and thus establish electrical connections with the device under test.

However, this arrangement has suffered from the drawback that it is difficult to increase the number of the probe arms beyond a predetermined number. That is to say, it is difficult to reduce the interval between the probe arms due to the inherent crowding which results from the above described type of assembly.

More specifically, when coming into contact with the terminals of the electronic device under the above mentioned predetermined force, the probe arms 2 tend to deflect upwardly and inwardly. Accordingly, the distance between the inboard ends of the arms tends to reduce the point where electrical shorts are apt to occur between adjacent arms (particularly between the probe points).

Thus, the prior art test probe assembly has encountered the limitation that it is not suited to testing electronic devices which have a large number of terminals.

A further and more serious problem relates to damage of the terminals of the device under test. When the contact points come into contact with the terminals of the electronic device, due to the horizontal movement which the probe points tend to undergo as a result of the above mentioned arm deflection, deep scratches tend to be formed in the surfaces of the terminals. This problem is particularly prevalent in the case wherein the terminals are made of, or have a coating of, a soft metal such as gold.

SUMMARY OF THE INVENTION

It is therefore an object of the present invention to provide a new and improved test probe assembly which allows testing of an electronic device with a large number of terminal pins and which obviates the chance of scratching or otherwise damaging the terminal pins of the device under test.

In brief, a multi-point test probe assembly according to the present invention comprises a plurality of electrically conductive probe arms each of which has one end fixedly secured to a substrate and electrically coupled to an electrically conductive line provided on the substrate; and has a curved or shaped springy intermediate portion from which a downwardly oriented leg extends to form a probe point which comes into contact with a terminal of an electronic device under test. The substrate has a supporting portion for supporting the curved portion of the probe arm in a manner wherein the curved or shaped portion of the probe arm is elastically deformable with respect to the supporting portion in response to contact of the downwardly extending contact portion with the corresponding terminal of the electronic device under test. Each of the contact portions are supported so that movement thereof is limited to reciprocation.

According to the present invention, a multi-point test probe assembly includes a housing fixedly held on a substrate on which a plurality of electrically conductive lines are formed. The lines are arranged to be coupled to an external testing system for testing an operation of an electronic device on the basis of signals therefrom. The housing is provided with a head portion in which a channel portion separates first and second protruding portions. The first and second protruding portions respectively have front surfaces and at least the front surface of the second protruding portion is arranged to be perpendicular to surfaces of the housing-holding substrate. Also included in the multi-point test probe assembly are a plurality of shaped electrically conductive probe arms. The electrically conductive probe arms are disposed at predetermined intervals from each other and are arranged to each comprises a root or clip portion which grips the first protruding portion of the head portion; an intermediate spring portion which extends into a channel formed in the head portion; and a needle portion extending along the front surface of the second protruding portion thereof so as to be reciprocal along the front surface of the second protruding portion.

The root portion is fixedly secured to the first protruding portion and arranged to be connected to an electrically conductive line on the substrate. The spring portion is arranged to engage a supporting member or portion formed on a lower surface of the first protruding portion in a manner to define a fulcrum point about which the spring portion is elastically deformable in response to the movement of the needle portion. The needle portion is reciprocatively supported on the front surface of the second protruding portion so that a terminal end thereof, which is adapted to electrically come into contact with a terminals of the electronic device under test, projects downwardly by a predetermined length below the head portion.

With the above-described arrangement, a multi-point test probe assembly according to the present invention can accommodate test of an electronic device having signal-receiving and signal-feeding terminals whose number is greater than 1000 and whose separation is less than 50 μm.

One aspect of the invention takes a form of a multi-point test probe assembly in which a probe arm features: a probe portion which is arranged to contact a terminal of a device under test; a mounting portion which is arranged to be connected to a structure of said probe assembly; resilient means for interconnecting said probe portion and said mounting portion so that the force which is exerted by said probe portion on said terminal remains essentially constant irrespective of the displacement of said probe portion with respect to said mounting portion within predetermined limits, and so that the tendency for said probe to undergo motion other than reciprocation is absent.

Another aspect of the invention takes a form of a multi-point test probe assembly, having a plurality of probe arms, each of said probe arms comprising: a probe portion which is arranged to contact a terminal of a device under test; a mounting portion which is arranged to be connected to a structure of said probe assembly; a spring portion interconnecting said probe portion and said mounting portion, said spring portion being so configured and arranged that the force which is exerted by said probe portion on said terminal remains essentially constant irrespective of a predetermined amount of displacement of said probe portion toward said mounting portion, said spring portion being arranged so that the tendency for said probe to undergo motion other than reciprocation is absent.

Still another aspect of the invention takes a form of a multi-point test probe assembly for testing an electronic device, comprising: a plurality of electrically conductive probe arms, each said arms having: a first portion which is fixedly secured to a support structure and electrically coupled to an electrically conductive line provided on said substrate; an essentially straight, needle-like portion which defines a contact probe, said contact probe having a point which is engageable with a terminal of said electronic device; and an intermediate portion which interconnects said first and needle-like portions and which is configured so that said second portion can be resiliently reciprocated toward and away from said first portion, said intermediate portion having a point about which it flexes with respect to said first portion, said point being arranged with respect to the extrapolation of said needle-like portion so that the extrapolation passes on the flexible side of said point and therefore through a flexible part of said intermediate portion.

BRIEF DESCRIPTION OF THE DRAWINGS the object and features of the present invention will become more readily apparent from the following detailed description of the preferred embodiments taken in conjunction with the accompanying drawings in which:

FIGS. 7a-7f illustrate various possible configurations of the probe arms to be used in the FIG. 5 multi-point test probe assembly and other embodiments of this invention;

FIG. 8 is a perspective view showing a multi-point test probe assembly according to a third embodiment of this invention;

DETAILED DESCRIPTION OF THE INVENTION

Figure 1:
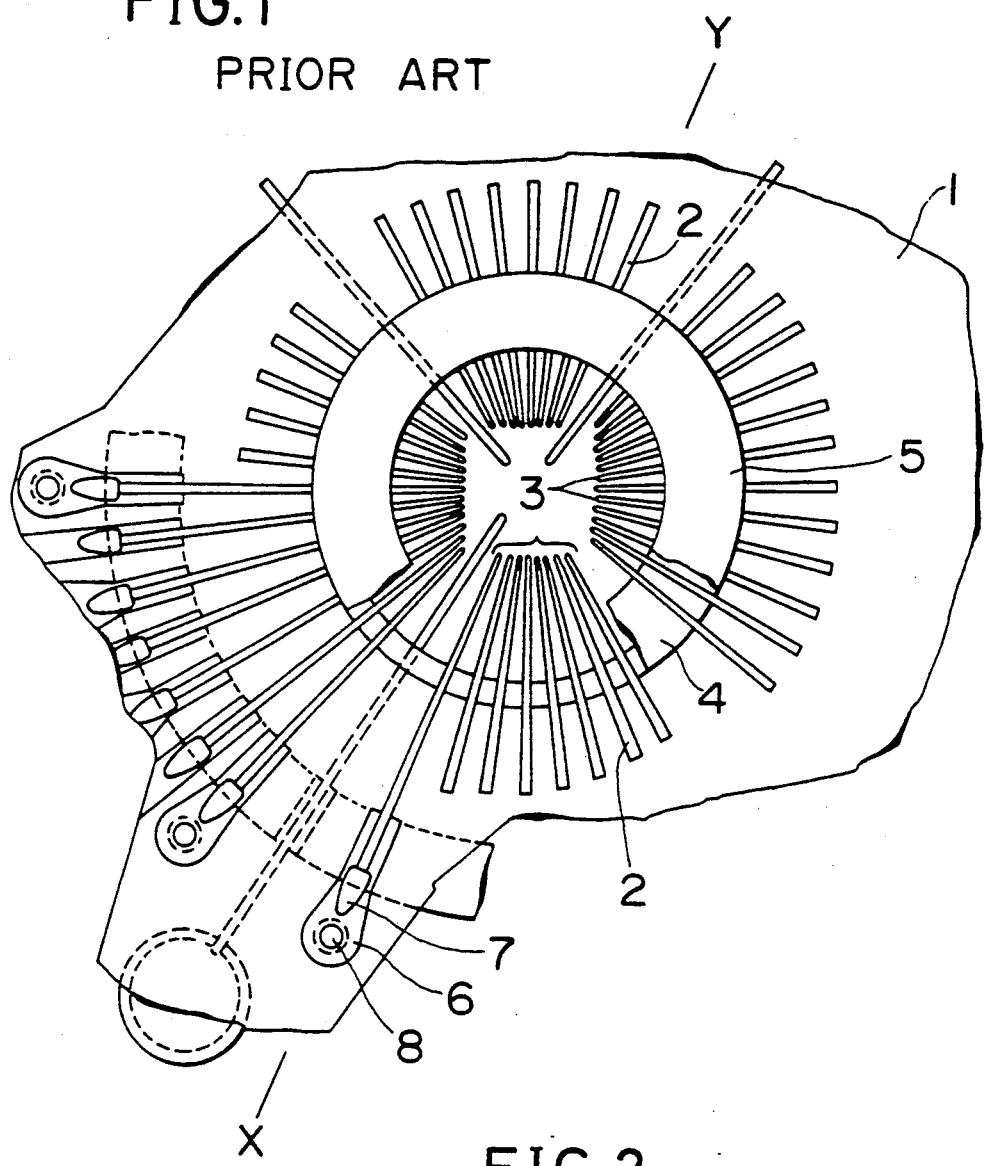
FIG. 1 is a partial plan view showing the conventional test probe assembly discussed in the opening paragraphs of the instant disclosure.
Figure 2:
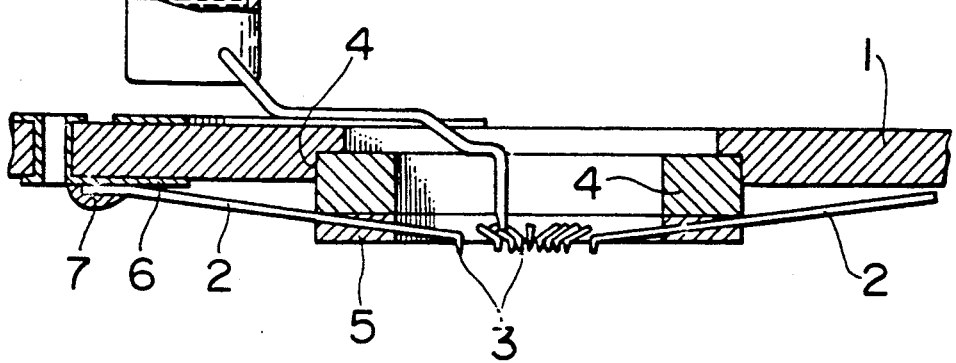
FIG. 2 is a cross-sectional view taken along section line X-Y in FIG. 1.
Figure 3:
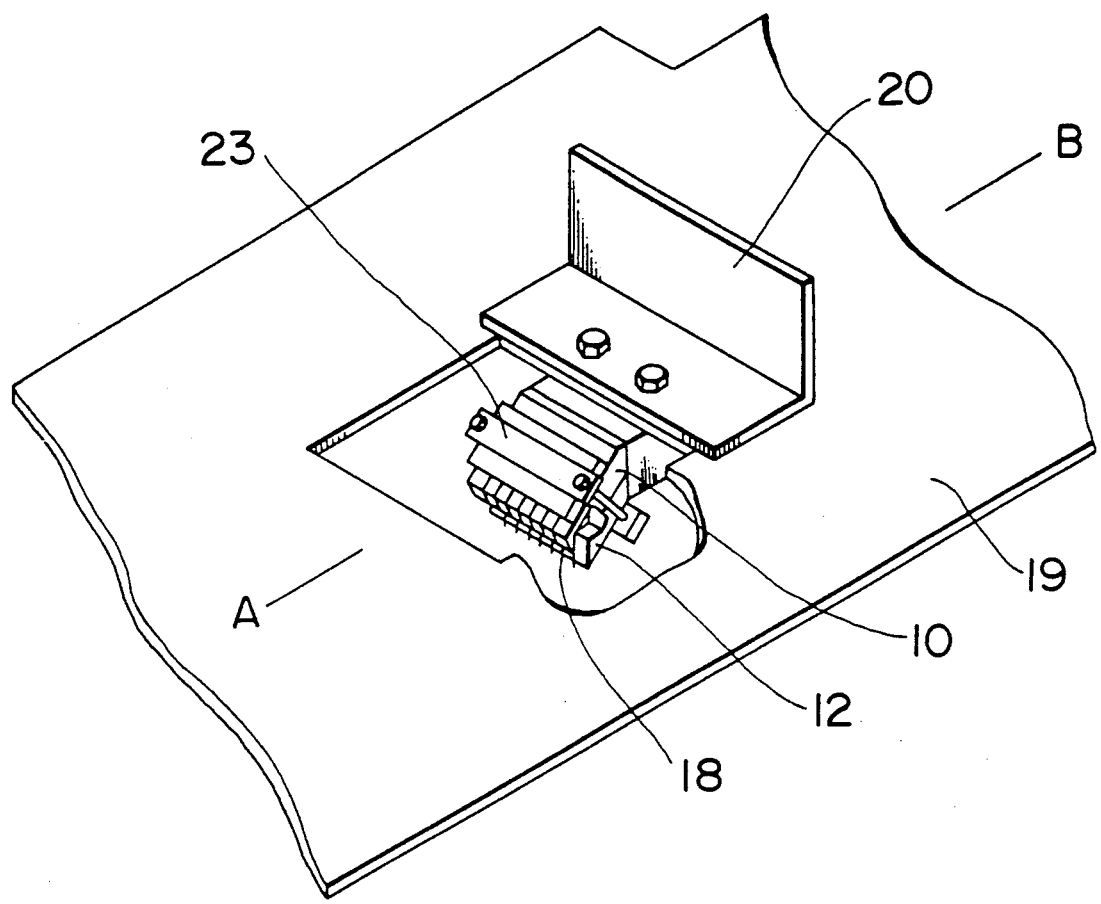
FIG. 3 is a perspective view illustrating a multi-point test probe assembly according to a first embodiment of the present invention.
Figure 4:
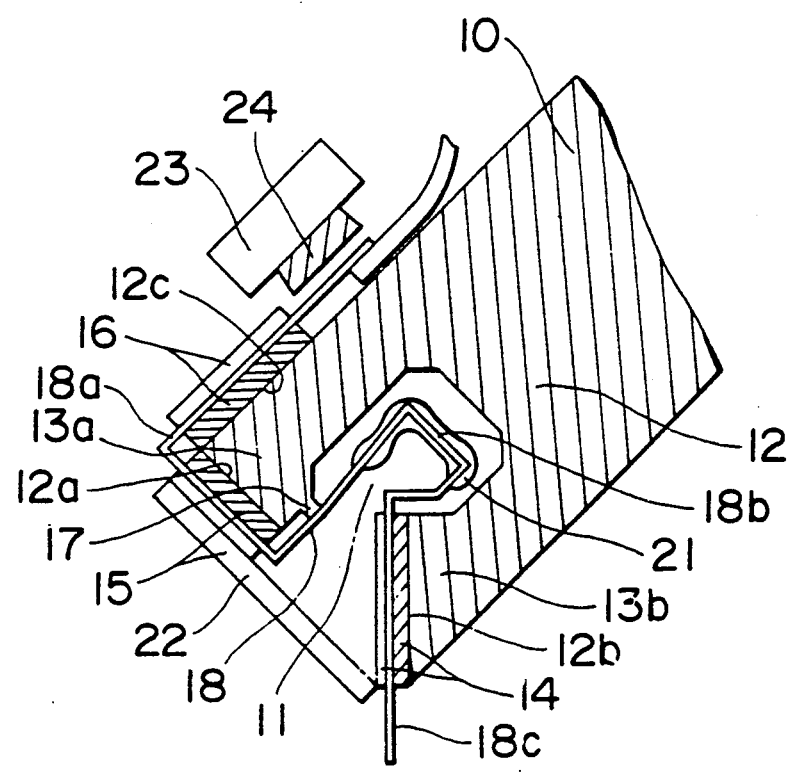
FIG. 4 is a cross-sectional view taken along section line A-B in FIG. 3 showing the first embodiment of the invention.

FIGS. 3 and 4 schematically illustrate a multi-point test probe assembly according to a first embodiment of the present invention. In FIGS. 3 and 4, the multi-point test probe assembly comprises a ceramic housing 10 which is mounted on a substrate 19 by way of a reinforcing plate 20. In this arrangement, a clamp 23 presses down one end of a flexible tape-like printed circuit (not shown) through which electrical connections are established between the multi-point test assembly and an external electronic-device testing system.

The housing 10 is provided with a rectangular head portion 12 which extends obliquely downward with respect to the substrate 19, The front wall of the head portion 12 is machined to form a relatively large groove or channel 11 which extends in a direction perpendicular to the longitudinal axis of the housing 10, i.e., extends traversely across the front of the housing 10. The channel 11 defines a supporting portion 13a having a surface 12a (which will be referred herinafter to as the oblique surface). This surface 12a is arranged substantially at right angles to the upper surface of the head portion 12. A probe guide portion 13b has a surface 12b (which will hereinafter be referred to as a vertical surface) which is formed so as to be perpendicular to the major surfaces of the substrate 19. A probe guide member 14 made of an abrasion resistance plastic material such as a PEEK (polyether ether ketone), is attached to the vertical surface 12b. The probe guide member 14 has thickness of about 300 μm and is arranged to have a plurality of parallel channels in its surface. These channels are arranged with a spacing or pitch of about 150 μm and are arranged so as to extend vertically (as seen in the drawings) along the vertical surface. Each of the channels formed in the guide member 14 has a depth of about 150 μm and a width of about 100 μm.

Layer-like probe attaching members 15, 16 are secured to the oblique surface 12a and the upper surface 12c of the probe support portion 13a (a portion of the upper surface of the head portion 12). These members are made of PEEK and have a thickness of 300 μm.

The layer-like probe supporting members 15 and 16 are also formed with channels whose number is equal to the number of the channels formed in the layer-like probe-guiding member 14. The pitch is also 150 μm. The channels of the probe supporting members 15 and 16 are arranged perpendicularly to the axis of channel 11 and aligned with the channels formed in the probe guide member 14.

Each of the channels of the probe supporting members 15 and 16 has a depth of about 150 μm and a width of about 100 μm. Provided on a portion of the lower surface of the probe supporting portion 13a (a portion of the upper surface of the channel 11) is a supporting member or portion 17 which protrudes downwardly in a direction normal to the lower surface of the probe support portion 13a and extends in the directions traversing the lower surface of the probe support portion 13a.

Also included in the multi-point test probe assembly are electrically conductive probe arms 18 each of which is formed of a stainless steel (SUS 304) line by way of example. Each of the arms has an essentially uniform diameter of 100 μm and has a nickel-gold plating which is about 2 μm thick.

The number of the probe arms 18 is equal to the number of the channels formed in the members 14, 15 and 16. In this embodiment the probe arms 18 each have a shape which substantially corresponds to the cross-sectional configuration of the head portion 12 and are disposed in the corresponding channels of the probe support members 15, 16 and the probe-guiding member 14.

More specifically, the upper ends of the arms are successively bent to conform to the corresponding channels of the probe support members 15, 16 and thus define a clip-like arrangement which grips the probe supporting portion 13a of the head portion 12. The next section of each arm is bent into a predetermined shape which tends to parallel the walls of the channel 11 in a spaced relationship thereto. The final section of each of the arms is such that it extends vertically downwardly along the corresponding channel of the probe-guiding member 14 and protrudes a predetermined distance from the lower edge thereof.

In brief, each of the probe arms 18 basically comprises three portions: a clip portion 18a, a curved spring defining portion 18b, and a needle-like probe portion 18c, respectively.

The clip portion 18a is fixedly secured in the corresponding channels of the fixing members 15 and 16 by means of an epoxy resin (not shown), for example. This securing additionally results in limiting movement and prevents contact with adjacent clip portions 18a.

The needle portion 18c is arranged so as to be slidably supported in the corresponding channel of the probe-guiding member 14. This limits the horizontal movement of the probe-needle portion 18c and prevents possible deformation of the probe-needle portion 18c upon coming into vertical contact with a terminal of the electronic device under test.

It is preferable that the diameter of the needle portion 18c (or the probe arm 18) is extremely small. If required, the needle portion 18c may be secured in the corresponding channel by applying slight pressure with a suitable arrangement. However, it is essential that this portion of the arm be slidable (i.e. reciprocal) with respect to the probe-guide member 14.

In the case higher abrasion resistance characteristic is required, it possible to coat the needle portion 18c (particularly, the point thereof which contacts with a terminal of the electronic device under test) with a suitable material such as tungsten or titanium.

The spring portion 18b is arranged to be supported at a location (in this case proximate the clip portion) by the supporting member 17 so that spring portion 18b is elastically deformable in accordance with vertical movements of the probe-needle portion 18c with the supporting member 17 acting as a fulcrum. That is, the spring portion 18b functions to provide a degree of resilience and to undergo a reduction in the radius of curvature in response to the upwardly vertical movement of the needle portion 18c.

Although the probe arms have been described as being made of stainless steel in this embodiment, it is within the scope of the present invention to use other metallic materials such as a piano wire or a beryllium copper wire provided that these materials exhibit the required resilience or spring characteristics.

Preferably, the surfaces of the supporting member 17 are coated with a suitable resin such as a fluorine resin so as form a coat having a thickness of about 200 angstroms, thereby preventing damage of the probe arms 18 due to the deformation of the spring portions 18b and the like. Moreover, each of the spring portions 18b is coated with an epoxy resin (21) having a thickness of about 20 μm, thereby preventing the contact with the adjacent spring portions 18b. It is also possible in accordance with scope of the present invention to use other resins such as an acrylic resin and a polyurethane resin, instead of the just mentioned epoxy resin. In FIG. 4, reference numeral 22 represents a cover for covering the probe support portion 15 and enclosing the channel 11.

When testing an electronic device, the multi-point test probe assembly is brought toward the device under test with the substrate 19 parallel to the upper surface of the electronic device and so that each of the needle portions 18c comes into contact with a surface of the corresponding terminal of the electronic device at substantially right angles thereto. In response to this contact, the probe-needle portions 18c are movable only in the directions substantially perpendicular to the terminals, i.e., vertically movable via the deformation of the spring portions 18b. This of course results in achieving stable contact due to generation of a biasing force in the spring portion 18b and obviates damaging the terminals of the electronic device.

In this embodiment the spring portion 18b is arranged so that the maximum deformation permits the needle portion to move about 300 μm. Within this displacement the pressure with which the needle portion is biased into contact with the terminals is maintained essentially constant at about 2.5 g.

In this embodiment, the total length of each of the probe arms 18 is about 27 mm. In this case, although the resistance value of the stainless steel line itself is about 2.5 ohms, the resistance value of the probe arm 18 actually results in being about 0.2 ohms due to the gold plating. This resistance permits an excellent connection (ohmic contact) to be established between the tested electronic device and the external testing system.

Predetermined portions of the upper ends of the clip portions 18a which are permitted to extend exposed from the probe-fixed portions, are arranged to be ohmic-contacted with one end portion of a flexible printed plate (not shown) by means of the clamping device 23 (made of a ceramic, for example) and an elastic member such as a silicon rubber sheet 24 whose thickness is about 200 μm. The other end of the flexible printed plate is coupled to the card-like edge connector provided on the substrate 19 so that the electronic device under test is electrically coupled through the probe-needle portions 18c to the external electronic-device testing system. Although in this embodiment the probe arms 18 are coupled to the flexible printed plate through the clamping device 23, it is also possible to couple the probe arms 18 thereto by means of other techniques such as the use of a suitable bonding material.

It will be noted that an important feature of the present invention comes in that the spring portion is arranged so that irrespective of the degree of deformation thereof (within acceptable limits), the force with which the needle portion engages the terminal of the device under test remains essentially constant. A further important point is that the point at which the fulcrum point is located is such that the extrapolation of the needle portion passes through a portion of spring portion "downstream" of the fulcrum point and therefore flexible supported. This minimizes the tendency for the needle portion to be subject to a torque which produces motion other than reciprocation.

Figure 5:
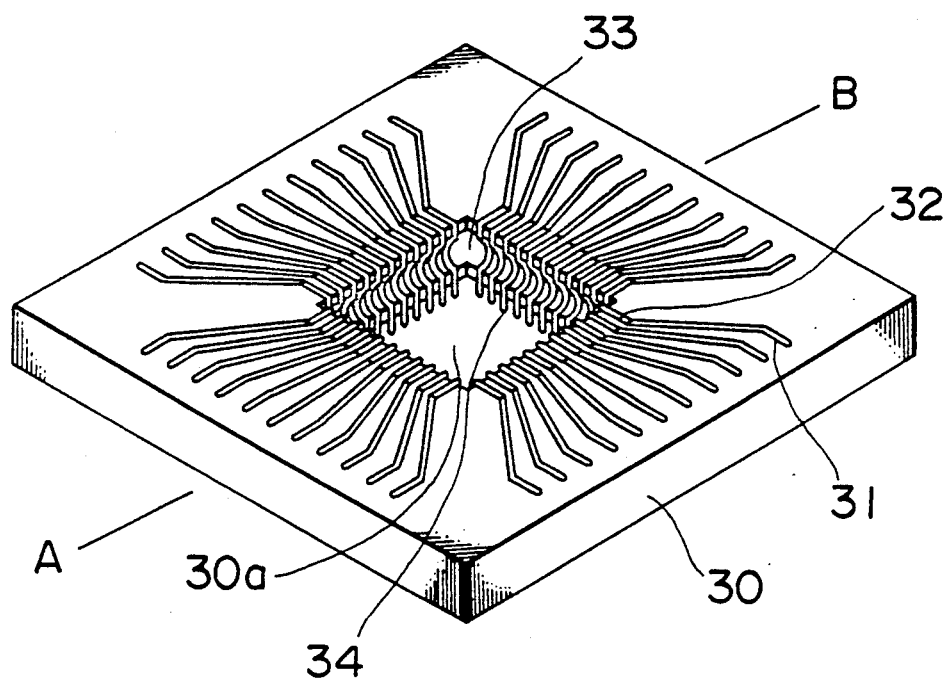
FIG. 5 is a perspective view showing a multi-point test probe assembly according to a second embodiment of the invention.
Figure 6:
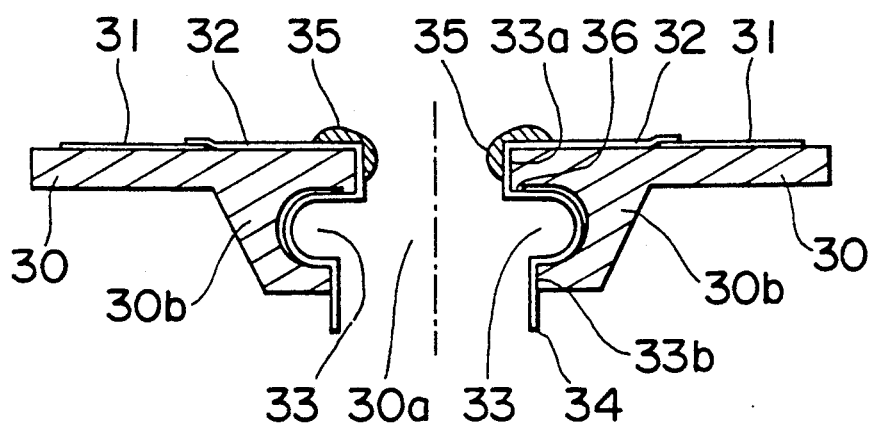
FIG. 6 is a cross-sectional view taken along section line A-B in FIG. 5.

FIGS. 5 and 6 shows a second embodiment of the present invention. This embodiment is suitable for testing a square electronic device having at its circumference a large number of signal-receiving and signal-feeding terminals. In this embodiment the multi-point test probe comprises a ceramic substrate 30 which has a square, or rectangular, through-hole (opening) 30a therein and is provided at its lower side with a probe supporting portion 30b which is formed along the circumference of the square through-hole 30a. The probe supporting portion 30b is arranged so as to protrude downwardly by a predetermined length with respect to the lower surface of the outer circumferential portion of the substrate 30. The inner walls of the probe supporting portion 30b which face the square through-hole 30a, are recessed so as to continuously form a substantially semicylindrical channel 33 which extends along the circumference of the square through-hole 30a, thereby forming upper and lower probe-supporting surfaces 33a and 33b which face the square through-hole 30a.

The substrate 30 has a flat upper surface provided with a plurality of electrically conductive metallic lines 31 each having a thickness of about 200 μm. These electrically conductive metallic lines 31 are provided by means of a well known metallization technique and so as to be arranged along the sides of the substrate 30 in a manner wherein the distance between the adjacent lines 31 reduces as they approach the perimeter of the through-hole 30a.

Also provided in this multi-point test probe assembly are electrically conductive probe arms 32 each of which is made of material such as beryllium. One end of the probe arms 32 is electrically coupled to the conductive metallic lines 31 by means of a suitable coupling technique. The outboard ends of the metallic lines 31 are arranged to be coupled to an external electronic-device testing system (not shown). On the other hand, the probe arms 32 are arranged at predetermined intervals in an essentially parallel relationship with each other and respectively extend from the upper surface of the substrate 30 to the upper probe-supporting surface 33a. Further, the spring portion of these probe arms 32 is arranged to extend proximate the surface of the semicylindrical channel 33. The subsequent portion of the arm then extends along a lower probe-supporting surface 33b so that a terminal end 34 of each of the probe arms 32 protrudes downwardly by a predetermined length (for example, 2.0 mm) from the lowermost level of the probe supporting portion 30b.

Accordingly, the terminals ends 34 of the probe arms 32 are successively arranged on a given plane with a predetermined separation (for example, 200 μm). The terminal ends 34 of the probe arms 32 serves as probe points for contacting the terminals (not shown) of the electronic device under test.

Each of the probe arms 32 of the second embodiment is arranged to have a first section which is fixedly secured with respect to the upper surface of the substrate 30 and the upper probe-supporting surface 33a by means such as an adhesive material (35), to have a second section which is deformably disposed in the channel 33 and a third section which is movable (slidable) with respect to the lower probe-supporting surface 33b.

A portion of each of the probe arms 32 is adapted to be supported by a projection 36 formed at the upper most edge of the channel 33. Thus, as will be appreciated from FIG. 7(a) for example, each of the probe arms 32 basically comprises three portions: a clip or mounting portion 32a, a spring or resilient portion 32b and a probe or needle portion 32c. The probe clip portion 32a, as described above, is fixedly secured to the upper surface of the substrate 30 and the upper probe-supporting surface 33a, the spring portion 32b is arranged to extend into the channel 33 so as to be elastically deformable with respect to a supporting point 36' which is the portion supported by the projection 36, and the needle portion 32c has at its terminal end the probe point 34 and is arranged to be movable with respect to the lower probe-supporting surface 33b in response to the probe point 34 coming into contact with a terminal of the electronic device to be tested. This arrangement generates an adequate and essentially constant reaction force due to the deformation of the spring portion 32b in response to the movement of the needle portion 32c. The generated reaction force allows a stable ohmic-contact of the probe point 34 with the tested electronic device terminal without damaging the surface of the respective terminal.

An important feature in the configuration of the probe arm 32 and the structure of the probe-supporting portion 30b is that the supporting point 36' and the top point of the spring portion 32b are positioned to be opposite to each other with respect to the longitudinal axis of the needle portion 32c, that is the extrapolation of the needle portion 32c crosses the line connecting the supporting point 36' and the top point of the spring portion 32b.

In the case of the probe arm 32 illustrated FIG. 7(a), the needle portion 32c extends vertically downward along the lower probe-supporting surface 33b which is perpendicular to the upper surface of the substrate 30, and the supporting point 36' and the top point of the spring portion 32b are positioned so as to be symmetrical with each other and so as to be located at substantially the same distance from the extension (longitudinal axis) of the probe-needle portion 32c.

However, the instant embodiment is not limited to this particular probe-arm arrangement, and can utilize any one of the other arrangements shown in FIGS. 7(b) to 7(f). In these latter mentioned cases, at least the probe supporting portion 30b may be arranged to have a cross-sectional configuration which corresponds to the configuration of the probe arm 32 selected.

In this case each of the probe arms 32 is made of beryllium copper wire having a diameter of about 100 μm. The contact force with respect to the electronic device terminal is about 3 g, thereby providing an adequate ohmic contact therewith. It is also possible to form the probe arm 32 of other materials such as a tungsten wire or a phosphor bronze wire. Although the probe arm 32 has a circular cross-section, it is within the scope of the present invention to use a wire having a square cross-section by way of example. During the manufacture of the probe arms 32, the wire is entirely plated with platinum palladium or platinum rhodium so ensure the required longevity.

Further, in the multi-point test probe assembly of this embodiment, the maximum stroke of the needle portions is set to be about 500 μm. It will be noted that the usual overdrive value is about 50 μm and accordingly, with the above mentioned exceptionally large value the chances of encountering any trouble during actual measuring operations is minimized.

Figure 9:
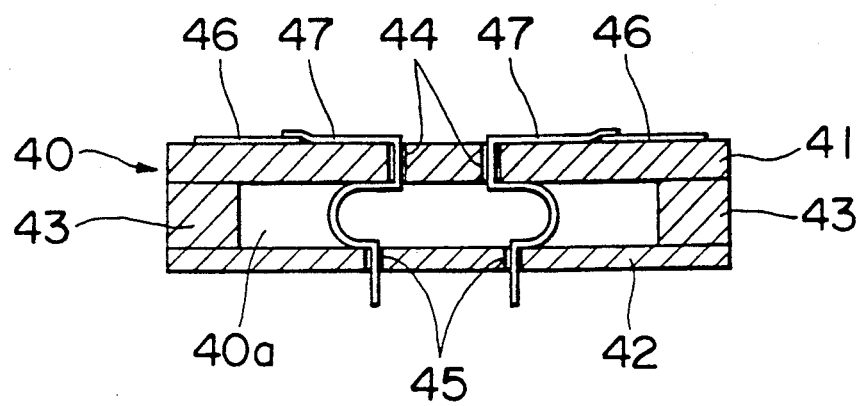
FIG. 9 is a cross-sectional view taken along section line A-B in FIG. 8.

FIGS. 8 and 9 show a multi-point test probe assembly according to a third embodiment of this invention. In this embodiment, the multi-point test probe assembly includes a ceramic housing 40 having therein a space 40a; the housing 40 comprising upper and lower square (or rectangular) substrates 41 and 42 which are arranged to sandwich a ceramic hollow supporting member 43 therebetween. The upper substrate 41 has a plurality of through-holes 44 extending perpendicular therethrough, and similarly the lower substrate 42 has a corresponding plurality of through-holes 45 extending perpendicularly therethrough. The through-holes 44 of the upper substrate 41 are separated by a predetermined distance and to define a square shape. The through-holes 45 of the lower substrate 42 are arranged in a similar manner. In this case the distance between each hole is set at 200 μm for example.

Formed on the upper surface of the upper substrate 41 (upper surface of the housing 40) is a plurality of electrically conductive lines 46 having a thickness of about 200 μm. The number of lines is equal to the number of the through-holes in the upper and lower substrates. The outboard ends of the conductive lines 46 are coupled to an external electronic-device testing system (not shown). The inboard ends are coupled to a plurality of probe arms 47. In this embodiment the probe arms are made of the same material as in the case of the above-described first and second embodiments.

Each of the probe arms 47 extends from the upper surface of the upper substrate 41 through the corresponding through-holes 44 and 45 of the upper and lower substrates 41 and 42 so as to protrude by a predetermined length (for example, 2.0 mm) from the lower surface of the lower substrate 42. In this instance each of the probe arms 47 has a portion which is bent to form an essentially U-shaped curved portion which is disposed in the space 40a. Further, the dimension of the square defined by the through-holes 44 is smaller than that defined by the through-holes 45. Accordingly, each of the probe arms 47 has a shape corresponding to that of each of the probe arms 32 illustrated in FIG. 7(a).

Due to the positioning of the probe arms 47 by the through-holes 44 and 45, the third embodiment enjoys the advantage that the positioning accuracy of the probe arms 47 is higher as compared with that of the second embodiment.

Figure 10:
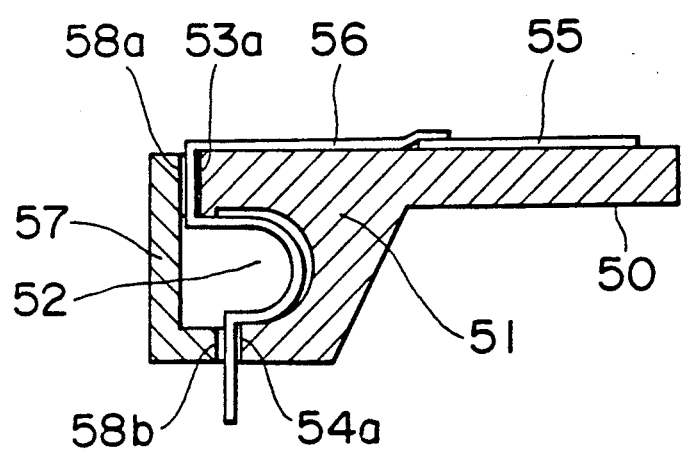
FIG. 10 is a cross-sectional view showing a multi-point test probe assembly according to a fourth embodiment of this invention.

FIG. 10 shows a fourth embodiment of the present invention. In this figure, a multi-point test probe assembly comprises a ceramic substrate 50 having a probe supporting portion 51 at one end thereof. As shown, this portion protrudes downwardly from the circumferential portion of the substrate 50 and is formed with a groove or channel 52. This channel 52 has a substantially semicylindrical configuration and is formed in a front surface of the probe supporting portion 51 in a manner which defines a probe supporting or mounting surface 53 (not shown) and a probe guide surface. The probe supporting surface 53 is arranged to have therein a plurality of parallel substantially semicylindrical channels 53a. The probe-guiding surface is also arranged to have therein a plurality of substantially semicylindrical channels 54a which are aligned with the above mentioned ones. The spacing between the channels is the same.

A plurality of electrically conductive lines 55 are provided on the upper surface of the substrate 50. One end of each of these lines are coupled to an external electronic-device testing system. The other end of each of the lines 55 are connected to a probe arm 56.

Each of the probe arms 56 is arranged to extend from an electrically conductive lines 55 to the end portion of the upper surface of the substrate 50, descend along the corresponding channel 53a of the probe support surface, along the inner surface of the channel 52, and then along the corresponding channel 54a of the probe-guiding surface so that the terminal end of the probe arm 56 extends vertically downward by a predetermined length from the lower surface of the probe supporting portion 51. The probe arms 56 are fixed with respect to the upper surface of the substrate 50.

Also included in the multi-point test probe assembly of this embodiment is an L-shaped ceramic cover 57 having first and second surfaces (both not shown in FIG. 10) which face the probe support surface having the channels 53a and the probe-guiding surface having the channels 54a, respectively. The first surface has therein a plurality of substantially semicylindrical channels 58a adapted to engagingly cover the portion of the probe arm 56 encased in the corresponding channel 53a. The second surface 57b also has a plurality of substantially semicylindrical channels 58b adapted to enclose the portion of the probe arm 56 encased in the corresponding channel 54a. In this case reciprocal movement is permitted.

That is to say, with the above arrangement, each of the channels 53a of the probe supporting surface is combined with the corresponding one of the channels 58a of the first surface of the cover 57 so as to form a tubular case which secures a probe arm 56 in position. Each of the channels 54a of the probe-guiding surface cooperates with a corresponding channel 58b so as to form a tube which reciprocatively supports the lower portion of the probe arm 56. Accordingly, the probe arms 56 provide essentially the same results in substantially corresponding in shape and function as the probe arm 32 illustrated in FIG. 7(a).

This multi-point test probe assembly has an advantage in that the manufacturing process is relatively simple and the exchange of the probe arms 32 is relatively easy.

Figure 11:
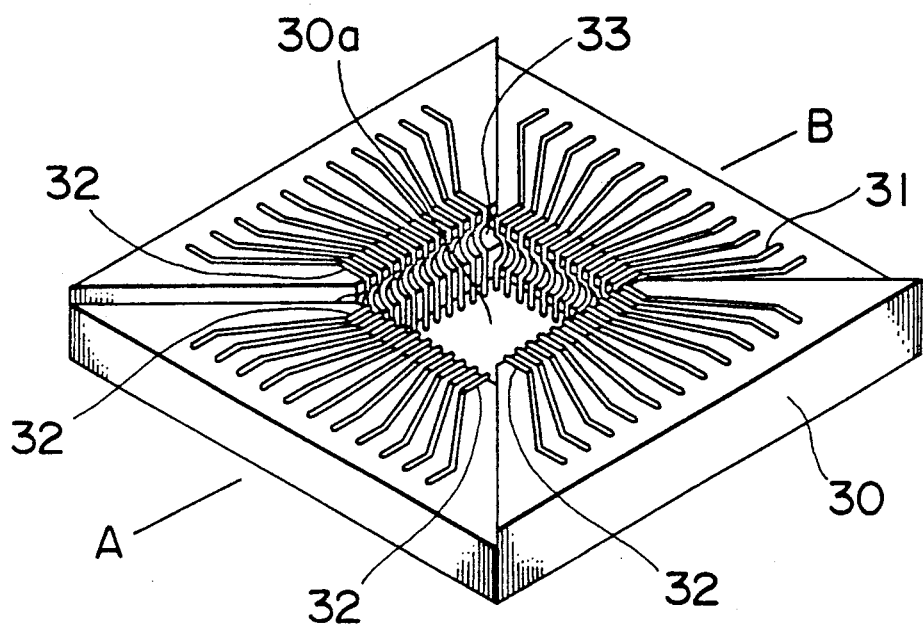
FIG. 11 is a perspective view showing a multi-point test probe assembly according to a fifth embodiment of this invention.
Figure 12:
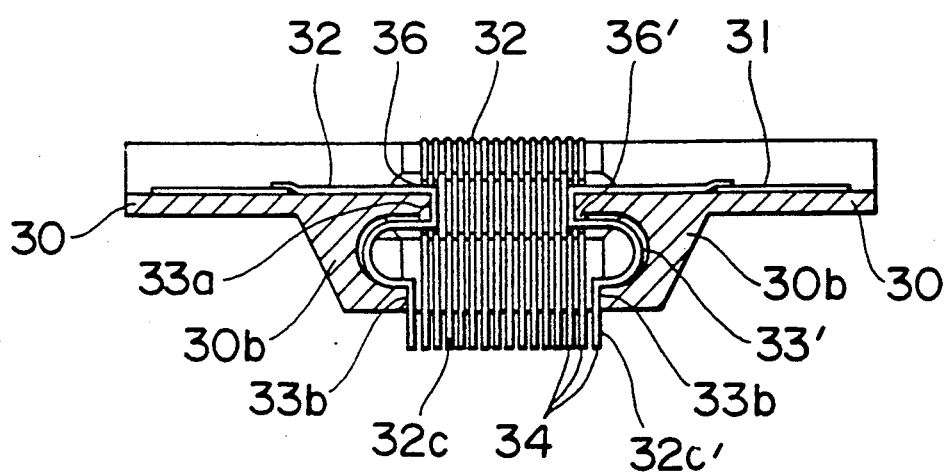
FIG. 12 is a cross-sectional view taken along section line A-B in FIG. 11.

FIGS. 11 and 12 show a multi-point test probe assembly according to a fifth embodiment of the present invention. The fifth embodiment is a modification of the above-described second embodiment. An object of the fifth embodiment is to be able to test a square electronic device which has terminals at its corners. In this embodiment this is achieved by further disposing additional electrically conductive probe arms at corner portions of the adjacent inner walls of a probe supporting portion facing a square through-hole of a substrate.

In the structure of the second embodiment illustrated in FIGS. 5 and 6, difficulty is encountered in locating probe arms at the very corner portions because of partial interference by probe arms which are located proximate said positions. Elements/parts corresponding to those illustrated in FIGS. 5 and 6 are denoted by the same reference numerals. Redundant description thereof will be omitted for brevity.

The major difference between the second and fifth embodiments comes in that the opposed edges of the opening formed in the substrate are located at different levels (viz., are vertically displaced with respect to one another). This results in the shoulder portions on which the clip portions of the arms are disposed, can project inwardly one over the top of the other in the manner which is best appreciated from FIG. 12. This eliminates the interference which would otherwise occur between arms which are closest to each corner.

As shown in FIGS. 11 and 12, the multi-point test probe assembly of the fifth embodiment comprises a ceramic substrate 30 which has at its center portion a square, or rectangular, through-hole (opening) 30a and is at its lower side provided with a probe mounting portion 30b formed so as to surround the square through-hole 30a and to protruded downwardly by a predetermined length. The probe supporting portion 30b has two pairs of inner walls which respectively face each other through the through-hole 30b. The inner walls which are in opposed relation to each other are arranged to be equal in thickness (height from the lower surface of the probe supporting portion 30b). The first pair of opposed walls have a thickness which is greater than that of the second pair.

The respective inner walls of the probe supporting portion 30b are partially recessed to form channels which extend horizontally (along the inner circumference of the substrate 30). The channels formed in the adjacent inner walls are arranged to be different (viz., height from the lower surface of the probe supporting portion 30b).

In FIGS. 11 and 12, the higher-positioned channels are denoted by reference numeral 33 while the lower-positioned channels are indicated by reference numeral 33'. The substrate 30 is constructed such that the probe support portion formed by recessing the lower-positioned channel 33' is fitted in the higher-positioned channel 33 as illustrated in FIGS. 11 and 12.

Similar to the second embodiment, the electrically conductive probe arms 32 are disposed so as to be arranged at predetermined intervals and to extend from the upper surface of the substrate 30 to the probe supporting surface (33a) of the probe supporting portion 30b; extend along the walls of the higher-positioned and lower-positioned channels 33 and 33'; and then advance along the probe-guiding surfaces (33b) so as to form the needle portions 32c and 32c', which respectively have terminal contacting probe points 34. In this embodiment sections of the curved portions (32b in FIG. 7) of the probe arm 32 are respectively supported by fulcrum defining supporting portions 36 and 36' formed on upper side walls of the higher-positioned and lower-positioned channels 33 and 33' (viz., at the lower sides of the probe support surfaces).

As a result of the above-described deposition, the needle portion 32c of each of the probe arms 33 is disposed at the side of the probe supporting portion which has the higher-positioned channel 33, results in the probe-needle portion 32c' being longer than of each of the probe arms 32 disposed at the other side of the probe supporting portion 30b which has the lower-positioned channel 33'. In the case that all the probe arms 32 are required to have the same resistance (impedance), it is necessary for the probe arms to have the same length.

Figure 13:
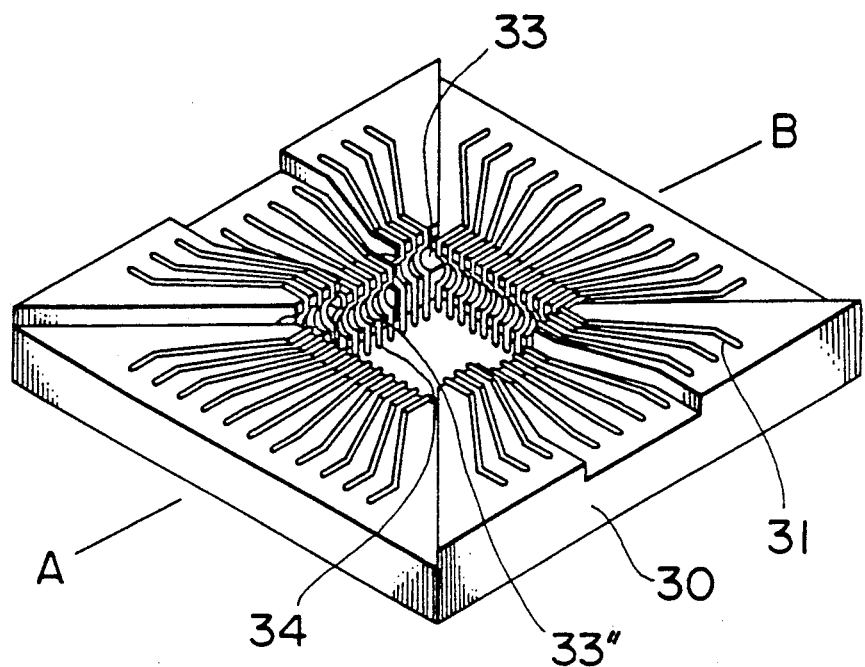
FIG. 13 is a perspective view showing a multi-point test probe assembly according to a sixth embodiment of the present invention.
Figure 14:
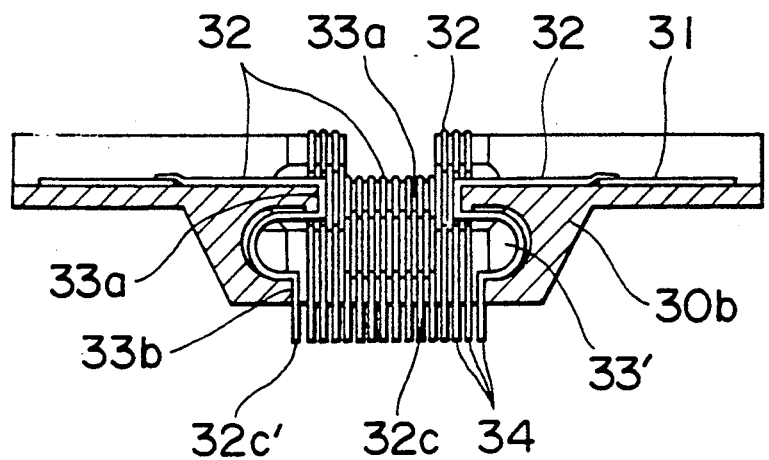
FIG. 14 is a cross-sectional view taken along section line A-B in FIG. 13.

FIGS. 13 and 14 show a sixth embodiment of this invention. This embodiment is a modification of the second and fifth embodiments. Parts corresponding to those in FIGS. 11 and 12 are denoted by the same reference numerals. Redundant description of the same will be omitted for brevity.

One difference between the multi-point test probe assemblies of FIGS. 5, 6, 11 and 12 and the instant sixth embodiment, is that the higher probe supporting portions are stepped so as to exhibit different thicknesses. The vertically oriented grooves formed in the lower steps are of course different in length as compared with the those formed in the higher. In addition to this, the horizontally extending channels which extend along each of the stepped walls is also stepped and formed into two portions 33 and 33". As will be appreciated from FIG. 13 the central portion 33" of the horizontally extending channel formed in the stepped walls, is located essentially at the same level as the corresponding channel in the non-stepped walls.

Electrically conductive probe arms 32 are disposed in along the inner walls in the same manner as in the second and fifth embodiments. This arrangement permits the resistances (impedances) of the probe arms 32 to be reduced as compared with the fifth embodiment and further allows providing the probe arms at the corner portions of the inner walls as similar to the fifth embodiment.

In the above mentioned embodiments, the substrate 30 may be formed to have a plurality of grooves on the surface thereof for accommodating the corresponding probe arms 32 therein.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention. For example, although, in the second to sixth embodiments the curved portion of each of the electrically conductive arms is constructed by bending an intermediate portion of the probe arm so as to have a substantially semicylindrical configuration, it is also possible to form this portion to have an angular shape in a manner similar to that of the first embodiment.

What is claimed is:

1. A multi-point test probe assembly including a support structure and a plurality of probe arms supported by said support structure, said support structure comprising means defining an open sided channel which extends in a direction substantially perpendicular to said probe arms and a plurality of open sided probe-receiving channels which are parallel to said probe arms;

each of said probe arms comprising:

a probe portion which is arranged to contact a terminal of a device under test;

a mounting portion which is connected to said support structure; and a spring portion interconnecting said probe portion and said mounting portion, said spring portion being received in said open sided channel.

2. A multi-point test probe assembly as claimed in claim 1, wherein said probe arms are aligned along said support structure with each of said probe arms being spaced by a predetermined distance and arranged to be brought into contact with a plurality of terminals of the device under test.

3. A multi-point test probe assembly as claimed in claim 1, wherein said multi-point test probe assembly further comprises:

a probe guide member defining a plurality of grooves in a surface thereof, with each of said plurality of grooves slidably receiving a probe arm.

4. A multi-point test probe assembly including a support structure and a plurality of probe arms supported by said support structure, said support structure comprising means defining a channel which extends in a direction substantially perpendicular to said probe arms;

each of said probe arms comprising:

a probe portion which is arranged to contact a terminal of a device under test;

a mounting portion which is connected to said support structure; and a spring portion interconnecting said probe portion and said mounting portion, said spring portion being received in said channel, wherein said channel is provided with a supporting fulcrum member, with said spring portion of each probe arm being positioned within said channel so as to be supported at said supporting fulcrum member so that said spring portions are elastically deformable.

* * * * *